US010707336B1

(12) United States Patent
Hashemi et al.

(10) Patent No.: US 10,707,336 B1
(45) Date of Patent: Jul. 7, 2020

(54) HIGH-PERFORMANCE LATERAL BJT WITH EPITAXIAL LIGHTLY DOPED INTRINSIC BASE

(71) Applicant: International Business Machines Corporation, Armonk, NY (US)

(72) Inventors: Pouya Hashemi, Purchase, NY (US); Tak H. Ning, Yorktown Heights, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/285,610

(22) Filed: Feb. 26, 2019

(51) Int. Cl.
| H01L 29/73 | (2006.01) |
| H01L 29/735 | (2006.01) |
| H01L 29/08 | (2006.01) |
| H01L 29/66 | (2006.01) |
| H01L 29/10 | (2006.01) |
| H01L 29/737 | (2006.01) |

(52) U.S. Cl.
CPC ........ H01L 29/735 (2013.01); H01L 29/0808 (2013.01); H01L 29/0821 (2013.01); H01L 29/1008 (2013.01); H01L 29/6625 (2013.01); H01L 29/737 (2013.01)

(58) Field of Classification Search
CPC ....... H01L 29/73; H01L 29/735; H01L 29/08; H01L 29/08; H01L 29/0808; H01L 29/082; H01L 29/0821; H01L 29/10; H01L 29/10; H01L 29/1008; H01L 29/66; H01L 29/662; H01L 29/6625; H01L 29/737

USPC ........................................................ 257/197
See application file for complete search history.

(56) References Cited

U.S. PATENT DOCUMENTS

| 8,927,379 B2 | 1/2015 | Adkisson et al. |
| 9,263,583 B2 | 2/2016 | Cai et al. |
| 9,331,097 B2 | 5/2016 | Cai et al. |
| 9,437,718 B1 | 9/2016 | Cai et al. |
| 9,525,027 B2 | 12/2016 | Hashemi et al. |
| 9,812,370 B2 | 11/2017 | Chang et al. |
| 2014/0353725 A1* | 12/2014 | Adkisson .............. H01L 29/737 257/197 |

(Continued)

OTHER PUBLICATIONS

U.S. Appl. No. 15/979,649 entitled "Single Crystalline Extrinsic Bases For Bipolar Junction Structures", filed May 15, 2018, 37 pages, Inventors: Hashemi et al.

(Continued)

*Primary Examiner* — Monica D Harrison
(74) *Attorney, Agent, or Firm* — Scully, Scott, Murphy & Presser, P.C.; Erik Johnson

(57) ABSTRACT

High-performance lateral bipolar junction transistors (BJTs) are provided in which a lightly doped upper intrinsic base region is formed between a lower intrinsic base region and an extrinsic base region. The lightly doped upper intrinsic base region provides two electron paths which contribute to the collector current, $I_C$. The presence of the lightly doped upper intrinsic base region increases the total $I_C$ and leads to higher current gain, $\beta$, if there is no increase of the base current, $I_B$.

20 Claims, 14 Drawing Sheets

(56) References Cited

U.S. PATENT DOCUMENTS

2018/0083126 A1    3/2018  Hashemi et al.

OTHER PUBLICATIONS

Hashemi, P., et al., "First Demonstration of Symmetric Lateral NPN Transistors on SOI Featuring Epitaxially-Grown Emitter/Collector Regions", 2017 IEEE SOI-3D-Subthreshold Microelectronics Technology Unified Conference (S3S), Oct. 2017, 2 pages.

Hashemi, P., et al., "Demonstration of Symmetric Lateral NPN Transistors on SOI Featuring Epitaxially Grown Emitter/Collector Regions," Journal of the Electron Devices Society, revised Nov. 13 & 20, 2017, accepted Nov. 20, 2017, Published Dec. 11, 2017, date of current version May 7, 2018, pp. 537-542, vol. 6.

Cai, J., et al., "Complementary Thin-Base Symmetric Lateral Bipolar Transistors on SOI", 2011 International Electron Devices Meeting (IEDM), Dec. 5-7, 2011, pp. 16.3-16.3.4.

Ning, T.H., et al., "On the Performance and Scaling of Symmetric Lateral Bipolar Transistors on SOI", IEEE Journal of the Electron Devices Society, Jan. 2013, pp. 21-27, vol. 1, No. 1.

\* cited by examiner

HIGH-PERFORMANCE LATERAL BJT WITH EPITAXIAL LIGHTLY DOPED INTRINSIC BASE

BACKGROUND

The present application relates to a semiconductor structure and a method of forming the same. More particularly, the present application relates to a lateral bipolar junction transistor (BJT) having increased collector current drive and current gain which is formed utilizing a replacement gate processing flow.

A bipolar junction transistor (BJT) is a semiconductor device containing an emitter region, a base region and a collector region having two P-N junctions with one of the P-N junctions being located between the emitter region and the base region, and the other P-N junction being located between the collector region and the base region. Each BJT can thus be classified as either PNP or NPN according to the arrangement of the p-type semiconductor material and the n-type semiconductor material. An NPN BJT has an n-type emitter region, a p-type base region, and an n-type collector region. A PNP BJT has a p-type emitter region, an n-type base region, and a p-type collector region. The function of a BJT is to amplify current, i.e., the collector current output (output signal) is larger than the base current (input signal).

One type of BJT is a lateral BJT. In a lateral BJT, the base region is located between the emitter region and collector region, with the emitter/base junction and the collector/base junction being formed between laterally arranged components. Lateral BJTs have drawn significant attention over the past decade due to their ease of processing and compatibility with mainstream complementary metal oxide semiconductors (CMOS). Lateral BJTs are suitable for digital as well as analog/mixed-signal applications. High-performance lateral BJTs that have increased collector current drive and current gain are needed to improve circuit speed.

SUMMARY

High-performance lateral bipolar junction transistors (BJTs) are provided in which a lightly doped upper intrinsic base region is formed between a lower intrinsic base region and an extrinsic base region. The lightly doped upper intrinsic base region provides two electron paths which contribute to the collector current, $I_C$. The presence of the lightly doped upper intrinsic base region increases the total $I_C$ and leads to higher current gain, $\beta$, if there is no increase of the base current, $I_B$.

In one aspect of the present application, a lateral BJT is provided. In one embodiment, the lateral BJT includes a lower intrinsic base region composed of a first semiconductor material of a first conductivity type that is located on a surface of a layer that is composed of at least a partially insulating material. An emitter region composed of a second semiconductor material of a second conductivity type, opposite the first conductivity type, is located laterally adjacent to, and contacting, a first side of the lower intrinsic base region, and a collector region composed of the second semiconductor material of the second conductivity is located laterally adjacent to, and contacting, a second side of the lower intrinsic base region, which is opposite the first side of the lower intrinsic base region. An upper intrinsic base region composed of a third semiconductor material of the first conductivity type is located on the lower intrinsic base region. The upper intrinsic base region has a lower dopant concentration than the lower intrinsic base region. An extrinsic base region composed of a fourth semiconductor material of the first conductivity type is located on the upper intrinsic base region. The extrinsic base region has a higher dopant concentration than both the upper and lower intrinsic base regions. A metal-containing fill material is located on the extrinsic base region.

In another aspect of the present application, a method of forming a lateral BJT is provided. In one embodiment, the method includes forming a sacrificial gate structure on a surface of an intrinsic base layer composed of a first semiconductor material of a first conductivity type. A dielectric spacer is present along a sidewall of the sacrificial gate structure and in both an emitter-side and a collector-side of the sacrificial gate structure. A notch is then created into the intrinsic base layer that is located in both the emitter-side and the collector-side of the sacrificial gate structure to provide a faceted intrinsic base portion in both the emitter-side and the collector-side. An emitter region composed of a second semiconductor material of a second conductivity type that is opposite the first conductivity type is formed above the faceted intrinsic base portion that is present in the emitter-side of the sacrificial gate structure and a collector region composed of the second semiconductor material of the second conductivity type is formed above the faceted intrinsic base portion that is present in the collector-side of the sacrificial gate structure. An interlayer dielectric (ILD) material is formed laterally adjacent to an upper portion of the sacrificial gate structure and on the emitter region and the collector region. The sacrificial gate structure is then removed to create a cavity and to physically expose a surface of a remaining portion of the intrinsic base layer which defines a lower intrinsic base region. An upper intrinsic base region composed of a third semiconductor material of the first conductivity type is formed in a lower portion of the cavity and on the physically exposed surface of the lower intrinsic base region. The upper intrinsic base region has a lower dopant concentration than the lower intrinsic base region. Next, an extrinsic base region composed of a fourth semiconductor material of the first conductivity type is formed on the upper intrinsic base region. The extrinsic base region has a higher dopant concentration than both the upper and lower intrinsic base regions. A metal-containing fill material is thereafter formed on the extrinsic base region and within a remaining portion of the cavity.

DETAILED DESCRIPTION

Figure 1:
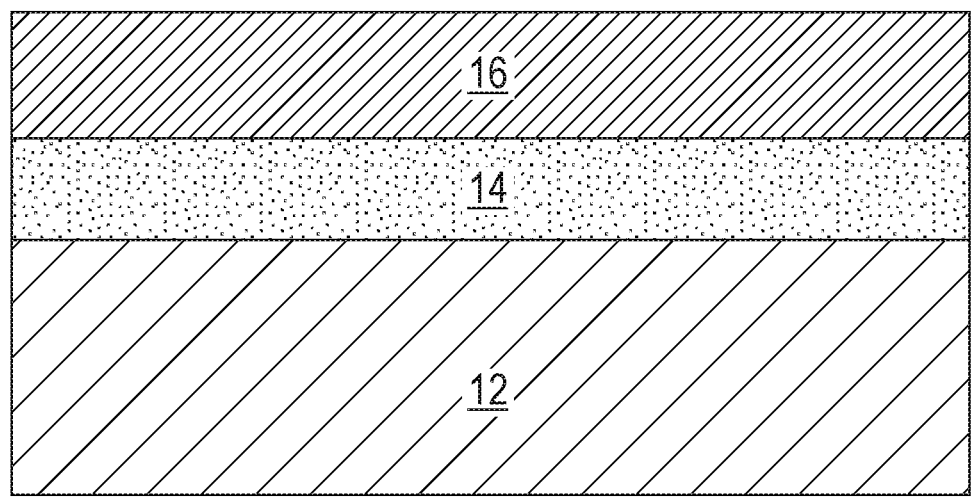
FIG. 1 is a cross sectional view of an exemplary semiconductor structure that can be employed in the present application and including, from bottom to top, a semiconductor substrate, a layer composed of at least a partially insulating material, and an intrinsic base layer composed of a first semiconductor material of a first conductivity type.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present application provides high-performance lateral BJTs (homojunction or heterojunction) in which a lightly doped upper intrinsic base region is formed between a lower intrinsic base region and an extrinsic base region. The lightly doped upper intrinsic base region provides two electron paths which contribute to the collector current, $I_C$. The first electron path is between the lower intrinsic base region and an emitter region and a collector region that are laterally adjacent to, and contacting the lower intrinsic base region. The second electron path is between the lower and upper intrinsic base regions, and the emitter region and collector region that are laterally adjacent to, and in contact with, the lower intrinsic base region. The presence of the lightly doped upper intrinsic base region increases the total $I_C$ and leads to higher current gain, $\beta$, if there is no increase of the base current, $I_B$. The base current, $I_B$, is determined by the hole injection from the base region to the emitter region and is inversely proportional to recombination time in the base region.

Referring now to FIG. 1, there is illustrated an exemplary semiconductor structure that can be employed in the present application. The exemplary structure of FIG. 1 includes, from bottom to top, a semiconductor substrate 12, a layer 14 composed of at least a partially insulating material, and an intrinsic base layer 16 composed of a first semiconductor material of a first conductivity type.

The semiconductor substrate 12 is composed of one or more semiconductor materials having semiconducting properties. By "semiconducting properties" it is meant a material whose electrical conductivity is between that of a conductive metal and an insulator. Examples of semiconductor materials that can be used as the semiconductor substrate 12 include, but are not limited to, silicon (Si), a silicon germanium (SiGe) alloy, a silicon germanium carbide (SiGeC) alloy, germanium (Ge), a III/V compound semiconductor, or a II/VI compound semiconductor. The semiconductor substrate 12 typically has an upper semiconductor material that is single-crystalline. The semiconductor substrate 12 can have any of the well-known crystal orientations including, for example, {100}, {110} or {111}.

The semiconductor substrate 12 that is employed in the present application is a bulk semiconductor substrate. The term "bulk semiconductor substrate" denotes a substrate that is composed entirely of one or more semiconductor materials, as defined above.

In one embodiment, the at least partially insulating material that provides layer 14 is composed of an electrical insulator. By "electrical insulator" it is meant a dielectric material whose internal electric charges do not flow freely and very little or no electrical current will flow through it under the influence of an electrical field. Examples of electrical insulators that can be used in the present application include, but are not limited to, silicon dioxide or boron nitride. A single electrical insulator or a multilayered stack of electrical insulators can be used as the at least partially insulating material that provides layer 14.

In another embodiment, the partially insulating material that provides layer 14 is composed of a material that has semi-insulating properties. By "semi-insulating properties" it is meant a wide-band-gap material that has semiconducting and insulating properties. Examples of materials having semi-insulating properties include, but are not limited to, InAlAs or GaAs. A single material having semi-insulating properties or a multilayered stack of materials having semi-insulating properties can be used as the at least partially insulating material that provides layer 14.

In yet another embodiment, the partially insulating material that provides layer 14 can include a multilayered stack of, and in any order, an electrical insulator, as defined above, and a semi-insulating material, as defined above.

Layer 14, which is composed of the at least partially insulating material, is a continuous layer which has a first surface (i.e., the bottommost surface) that forms an interface with a topmost surface of the semiconductor substrate 12, and a second surface (i.e., the topmost surface) that is opposite to the first surface that forms an interface with a bottommost surface of the intrinsic base layer 16. Layer 14, which is composed of the at least partially insulating material, can have a thickness that is from 10 nm to 400 nm; although thicknesses can be used in the present application for the thickness of layer 14.

As mentioned above, the intrinsic base layer 16 is composed of a first semiconductor material. The first semiconductor material includes one of the semiconductor materials mentioned above for the semiconductor substrate 12. In one embodiment, the first semiconductor material that provides the intrinsic base layer 16 is a compositionally same semiconductor material as the semiconductor substrate 12. By way of an example, the first semiconductor material that provides the intrinsic base layer 16 and the semiconductor substrate 12 are both composed of one of silicon, germanium, or a Group III-V compound semiconductor. In another embodiment, the first semiconductor material that provides the intrinsic base layer 16 is a compositionally different semiconductor material than the semiconductor substrate 12. By one of an example, the first semiconductor material that provides the intrinsic base layer 16 is composed of a III-V compound semiconductor, and the semiconductor substrate 12 is composed of silicon or germanium.

As mentioned above, the first semiconductor material that provides the intrinsic base layer 16 is of the first conductivity type. In one embodiment, the first conductivity type is n-type. That is, the first semiconductor material that provides the intrinsic base layer 16 includes an n-type dopant present therein. The term "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous.

In another embodiment, the first conductivity type is p-type. That is, the first semiconductor material that provides the intrinsic base layer 16 includes a p-type dopant present therein. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium.

Notwithstanding the type of dopant (n-type or p-type) present in the first semiconductor material that provides the intrinsic base layer 16, the intrinsic base layer 16 has a dopant concentration from $1\times10^{18}$ atoms/cm$^3$ to $5\times10^{21}$ atoms/cm$^3$, although other dopant concentrations are also conceived for the intrinsic base layer 16. The intrinsic base layer 16 can have a thickness that is from 25 nm to 500 nm; although thicknesses can be used in the present application for the thickness of the intrinsic base layer 16.

The exemplary semiconductor structure shown in FIG. 1 can be formed utilizing conventional techniques that are well-known to those skilled in the art. In one example, the exemplary semiconductor structure shown in FIG. 1 can be formed utilizing a process referred to as SIMOX (i.e., separation by ion implantation of oxygen) in which oxygen ions are implanted into a bulk semiconductor substrate to form a buried oxygen implant region in the bulk semiconductor substrate, and thereafter a high temperature anneal (greater than 550° C.) is used to convert the buried oxygen implant region into a buried oxide.

In another example, the exemplary semiconductor structure shown in FIG. 1 can be formed by bonding two wafers together. For example, wafer bonding can include providing a first wafer that includes the semiconductor substrate 12 and layer 14, and a second wafer that includes the intrinsic base layer 16 and a sacrificial, i.e., handle, substrate, bringing the two wafers into intimate contact with each other, heating the contacted wafers at room temperature or above, and then removing the sacrificial, i.e., handle, substrate, from the bonded wafers.

In yet another example, the exemplary semiconductor structure shown in FIG. 1 can be formed by depositing layer 14 composed of the at least partially insulating material on a surface of the semiconductor substrate 12. The depositing can include any conventional deposition process including, but not limited to, chemical vapor deposition (CVD), plasma enhanced chemical vapor deposition (PECVD), atomic layer deposition (ALD), or physical vapor deposition (PVD). Alternatively, and when layer 14 is composed of a semi-insulating material, an epitaxial growth process can be used to deposit layer 14 on the surface of semiconductor substrate 12. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of layer 14 can be performed utilizing any well-known precursor gas or gas mixture. Carrier gases like hydrogen, nitrogen, helium and argon can be used.

Following, the deposition of layer 14, the first semiconductor material that provides the intrinsic base layer 16 is formed on a physically exposed surface of layer 14 utilizing a deposition process such as, for example, chemical vapor deposition (CVD), plasma enhanced chemical vapor deposition (PECVD), atomic layer deposition (ALD), or physical vapor deposition (PVD). N-type or p-type dopants, as defined above, can then be introduced into the first semiconductor material to provide the intrinsic base layer 16. The dopants can be introduced into the first semiconductor material by ion implantation, gas phase doping, plasma doping, plasma immersion ion implantation, cluster doping, infusion doping, liquid phase doping, solid phase doping, and/or any suitable combination of those techniques.

Alternatively, an epitaxial growth process, as mentioned above, can be used to form a layer of the first semiconductor material that provides the intrinsic base layer 16. In some embodiments, the n-type dopant or p-type dopant that is present in the first semiconductor material is introduced into the precursor gas or gas mixture. In other embodiments, the n-type dopant of p-type dopant is introduced into the first semiconductor after the epitaxial growth process utilizing one of the techniques mentioned above.

Figure 2:
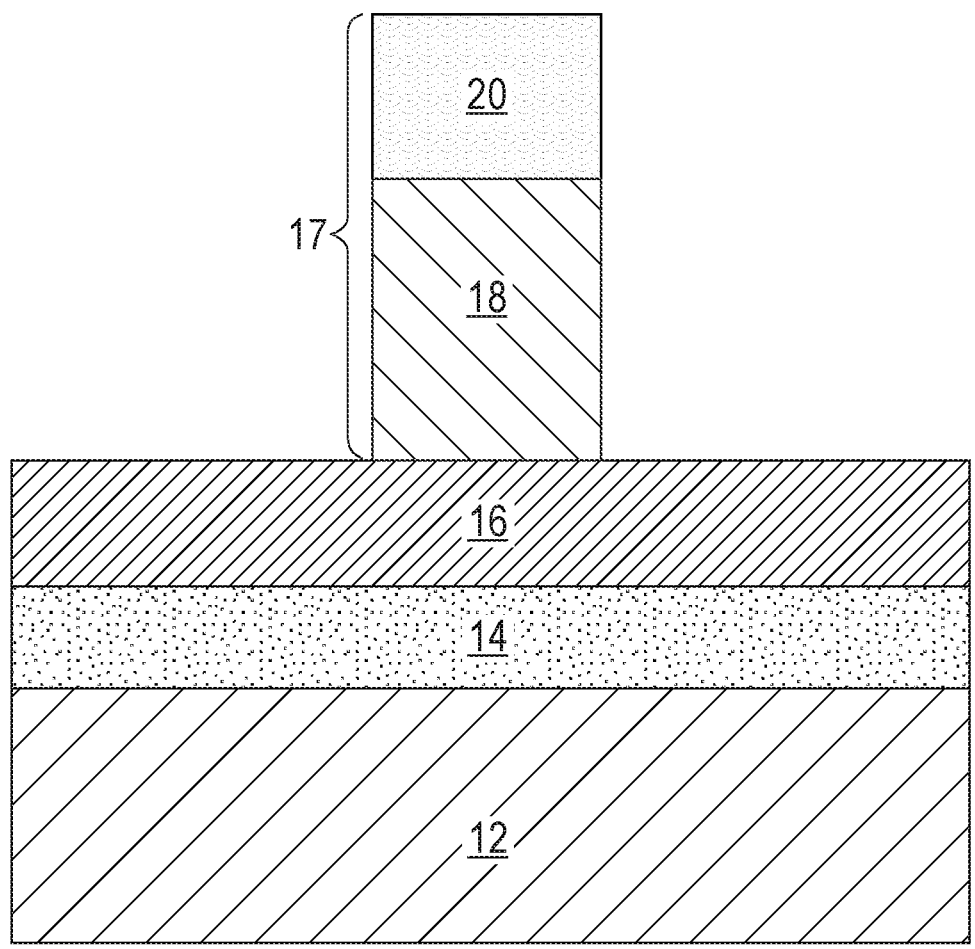
FIG. 2 is a cross sectional view of the exemplary semiconductor structure of FIG. 1 after forming a sacrificial gate structure on a surface of the intrinsic base layer.

Referring now to FIG. 2, there is illustrated is a cross sectional view of the exemplary semiconductor structure of FIG. 1 after forming a sacrificial gate structure 17 on a surface of the intrinsic base layer 16. The sacrificial gate structure 17 covers only a portion of the intrinsic base layer 16; other portions of the intrinsic base layer 16 are left physically exposed. Although the present application describes and illustrates a single sacrificial gate structure 17, the present application contemplates embodiments in which a plurality of spaced apart sacrificial gate structures is formed on the intrinsic base layer 16.

The sacrificial gate structure 17 can include a single sacrificial material or a stack of two or more sacrificial materials (i.e., the sacrificial gate structure 17 includes at least one sacrificial material). In one embodiment, the at least one sacrificial material comprises, from bottom to top, a sacrificial gate dielectric material (not shown), a sacrificial gate material 18 and a sacrificial dielectric cap 20. In some embodiments, the sacrificial gate dielectric material and/or the sacrificial dielectric cap 20 can be omitted and only a sacrificial gate material 18 is formed.

The at least one sacrificial material can be formed by forming a blanket layer (or layers) of a material (or various materials) and then patterning the material (or various materials) by lithography and an etch. In one embodiment, the at least one sacrificial material can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate dielectric material. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition (ALD).

After forming the blanket layer of sacrificial gate dielectric material, a blanket layer of a sacrificial gate material 18 can be formed on the blanket layer of sacrificial gate dielectric material. The sacrificial gate material 18 can include any material including, for example, polysilicon, amorphous silicon, a spin-on oxide, an elemental metal (e.g., tungsten, titanium, tantalum, aluminum, nickel, ruthenium, palladium and platinum), an alloy of at least two elemental metals or multilayered combinations thereof. The sacrificial gate material 18 can be formed utilizing a deposition process including, for example, chemical vapor deposition (CVD), plasma enhanced chemical vapor deposition (PECVD), physical vapor deposition (PVD), sputtering, atomic layer deposition (ALD), spin-coating or other like deposition processes.

After forming the blanket layer of sacrificial gate material 18, a blanket layer of a sacrificial gate cap material 20 can be formed. The sacrificial gate cap material 20 can include a hard mask material such as, for example, silicon dioxide and/or silicon nitride. The sacrificial gate cap material 20 can be formed by any suitable deposition process such as, for example, chemical vapor deposition (CVD) or plasma enhanced chemical vapor deposition (PECVD).

After providing the above mentioned sacrificial material stack (or any subset of the sacrificial materials), lithography and etching can be used to pattern the sacrificial material stack (or any subset of the sacrificial materials) and to provide the sacrificial gate structure 17.

Figure 3:
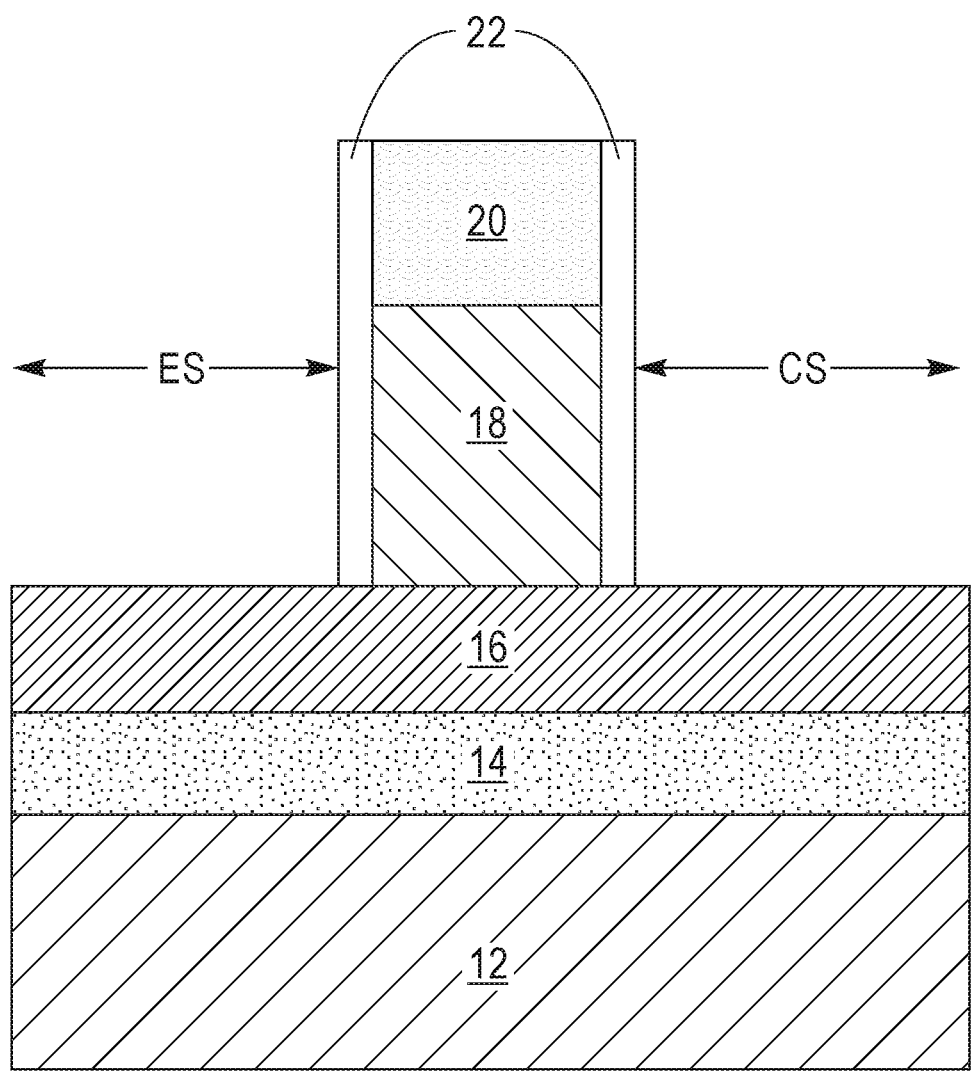
FIG. 3 is a cross sectional view of the exemplary semiconductor structure of FIG. 2 after forming a dielectric spacer along a sidewall of the sacrificial gate structure.

Referring now to FIG. 3, there is illustrated the exemplary semiconductor structure of FIG. 2 after forming a dielectric spacer 22 along a sidewall of the sacrificial gate structure 17 and in an emitter-side, ES, of the sacrificial gate structure 17, and in the collector-side, CS, of the sacrificial gate structure 17. The emitter-side, ES, is an area in which the emitter region will be subsequently formed, and the collector-side, CS, is the area in which the collector region will be subsequently formed. The sacrificial gate structure 17 and the dielectric spacer 22 cover only a portion of the intrinsic base layer 16; other portions of the intrinsic base layer 16 are left physically exposed.

The dielectric spacer 22 is composed of a dielectric spacer material, which is typically compositionally different from the sacrificial gate cap material 20. One example of a dielectric spacer material that can be employed in the present application is silicon nitride. The dielectric spacer 22 can be formed by deposition of a first dielectric spacer material, followed by a spacer etch. The deposition of the dielectric spacer material includes, for example, chemical vapor deposition (CVD), plasma enhanced chemical vapor deposition (PECVD), or physical vapor deposition (PVD). The spacer etch can include a reactive ion etch.

Figure 4:
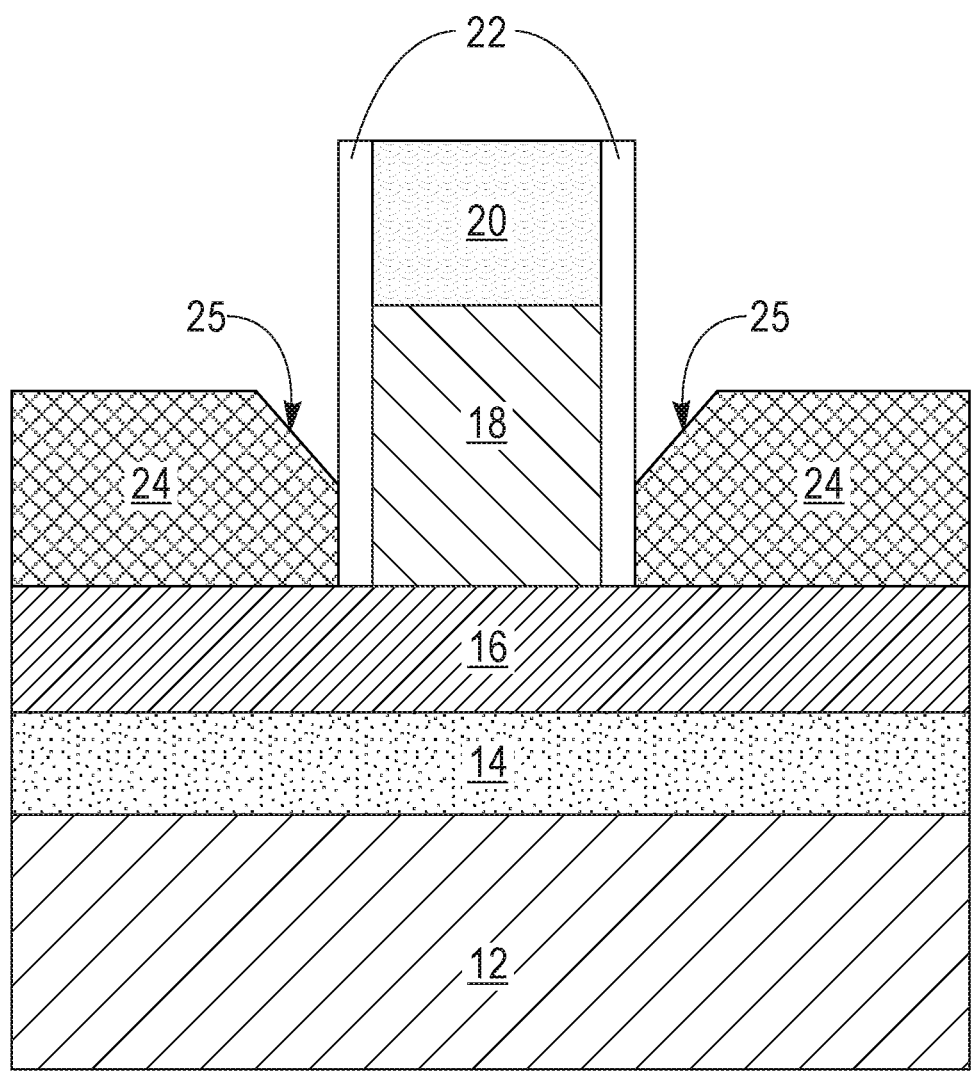
FIG. 4 is a cross sectional view of the exemplary semiconductor structure of FIG. 3 after forming a sacrificial faceted epitaxial semiconductor material in both an emitter-side and a collector-side of the sacrificial gate structure and on physically exposed portions of the intrinsic base layer that are not covered by the dielectric spacer and the sacrificial gate structure.

Referring now to FIG. 4, there is illustrated the exemplary semiconductor structure of FIG. 3 after forming a sacrificial faceted epitaxial semiconductor material 24 in both the emitter-side, ES, and the collector-side, CS, and on physically exposed portions of the intrinsic base layer 16 that are not covered by the dielectric spacer 22 and the sacrificial gate structure 17. Each sacrificial faceted epitaxial semiconductor material 24 that is formed has a faceted surface 25 that is adjacent an outermost sidewall of dielectric spacer 22.

Each sacrificial faceted epitaxial semiconductor material 24 can include one of the semiconductor materials mentioned above for the semiconductor substrate 12 and must have an etch selectivity that is different from the first semiconductor material that provides the intrinsic base layer 16. In one example, each sacrificial faceted epitaxial semiconductor material 24 is composed of germanium.

Each sacrificial faceted epitaxial semiconductor material 24 can be formed utilizing an epitaxial growth process, as defined above. The faceted surface 25 is provided by tuning/selecting epitaxial growth conditions including but not limited to, pressure, temperature and precursor flow rates. Such tuning is well-known to those skilled in the art. In some embodiments, desired {111} crystallographic planes of the semiconductor material that provides each sacrificial faceted epitaxial semiconductor material 24 are grown epitaxially.

Figure 5:
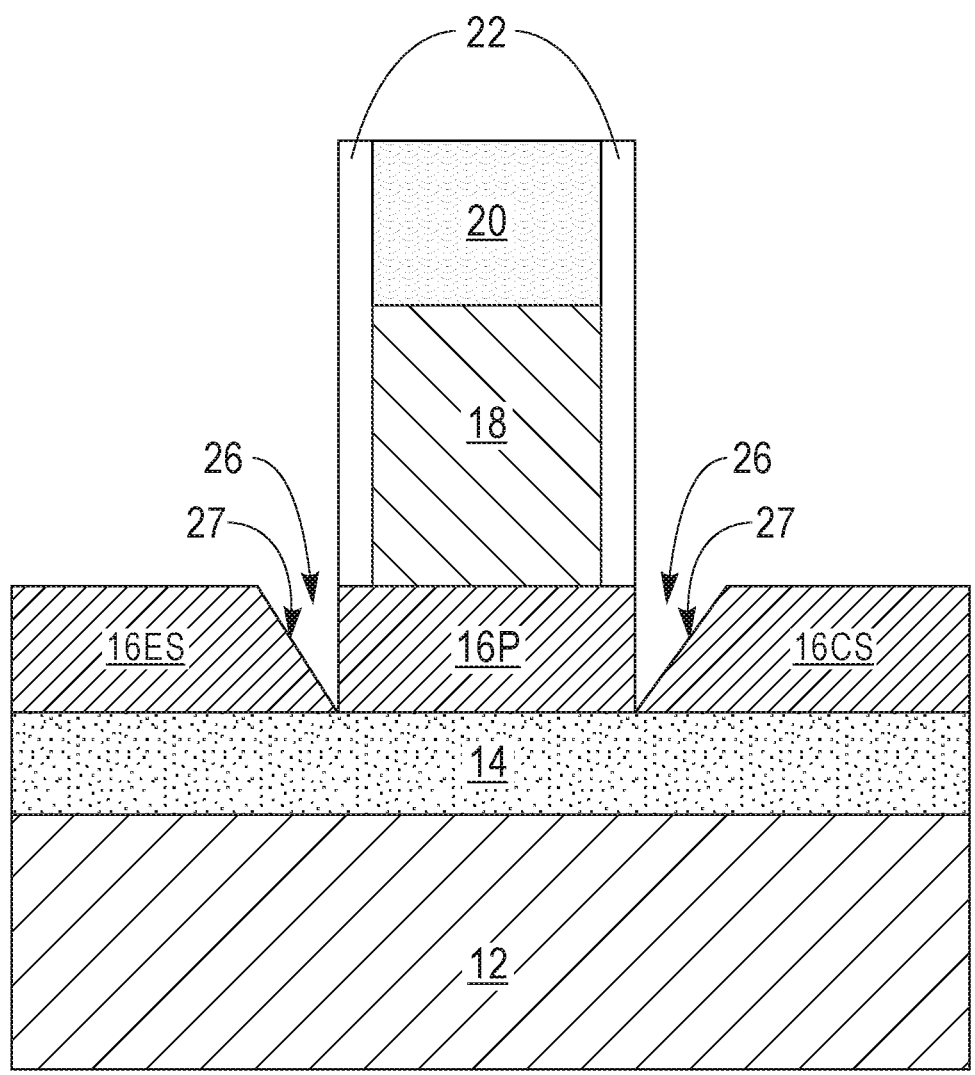
FIG. 5 is a cross sectional view of the exemplary semiconductor structure of FIG. 4 after removing the sacrificial faceted semiconductor material from both the emitter-side and the collector-side of the sacrificial gate structure, wherein during the removal of the sacrificial faceted semiconductor material a notch is created into the intrinsic base layer that is located in both the emitter-side and the collector-side providing a faceted intrinsic base portion in both the emitter-side and the collector-side.

Referring now to FIG. 5, there is illustrated the exemplary semiconductor structure of FIG. 4 after removing the sacrificial faceted semiconductor material 24 from both the emitter-side, ES, and the collector-side, CS. During the removal of the sacrificial faceted semiconductor material 24 a notch 26 is created into the intrinsic base layer 16 that is located in the emitter-side, ES, and the collector-side, CS, which, in turn, provides a faceted intrinsic base portion in both the emitter-side, ES, and the collector-side, CS. The faceted intrinsic base portion in the emitter-side, ES, can be referred to as an emitter-side faceted intrinsic base portion 16ES, while the faceted intrinsic base portion in the collector-side, CS, can be referred to as a collector-side faceted intrinsic base portion 16CS. Notch 26 extends completely through the intrinsic base layer 16 that is not covered by the dielectric spacer 22 and the sacrificial gate structure 17. Notch 26 is in the shape of an inverted triangle in which the tip of the inverted triangle extends down, and exposes a portion of the layer 14 that is located beneath the intrinsic base layer 16.

The emitter-side faceted intrinsic base portion 16ES has a faceted surface 27, and the collector-side faceted intrinsic base portion 16CS also has a faceted surface 27. A portion of the intrinsic base layer 16 remains beneath the dielectric spacer 22 and the sacrificial gate structure 17. This remaining portion of the intrinsic base layer 16 that is beneath the dielectric spacer 22 and the sacrificial gate structure 17 can be referred to as intrinsic base layer portion 16P. The intrinsic base layer portion 16P has outermost edges that are physically exposed after notch 26 formation.

As is shown, the faceted surface 27 of both the emitter-side faceted intrinsic base portion 16ES and the collector-side faceted intrinsic base portion 16CS extend outwards from a topmost surface to a bottommost surface and is in proximity to the intrinsic base layer portion 16P.

Each of the emitter-side faceted intrinsic base portion 16ES, the collector-side faceted intrinsic base portion 16CS, and the intrinsic base layer portion 16P is composed of the first semiconductor material of the first conductivity type.

The removal of the sacrificial faceted semiconductor material 24 from both the emitter-side, ES, and the collector-side, CS, and the subsequent formation of the notch 26 can be performed utilizing any dry etching process including, for example, reactive ion etching. The etching process is a partial etch and does not completely remove the intrinsic base layer 16 that is not protected by the dielectric spacer 22 and the sacrificial gate structure 17.

Figure 6:
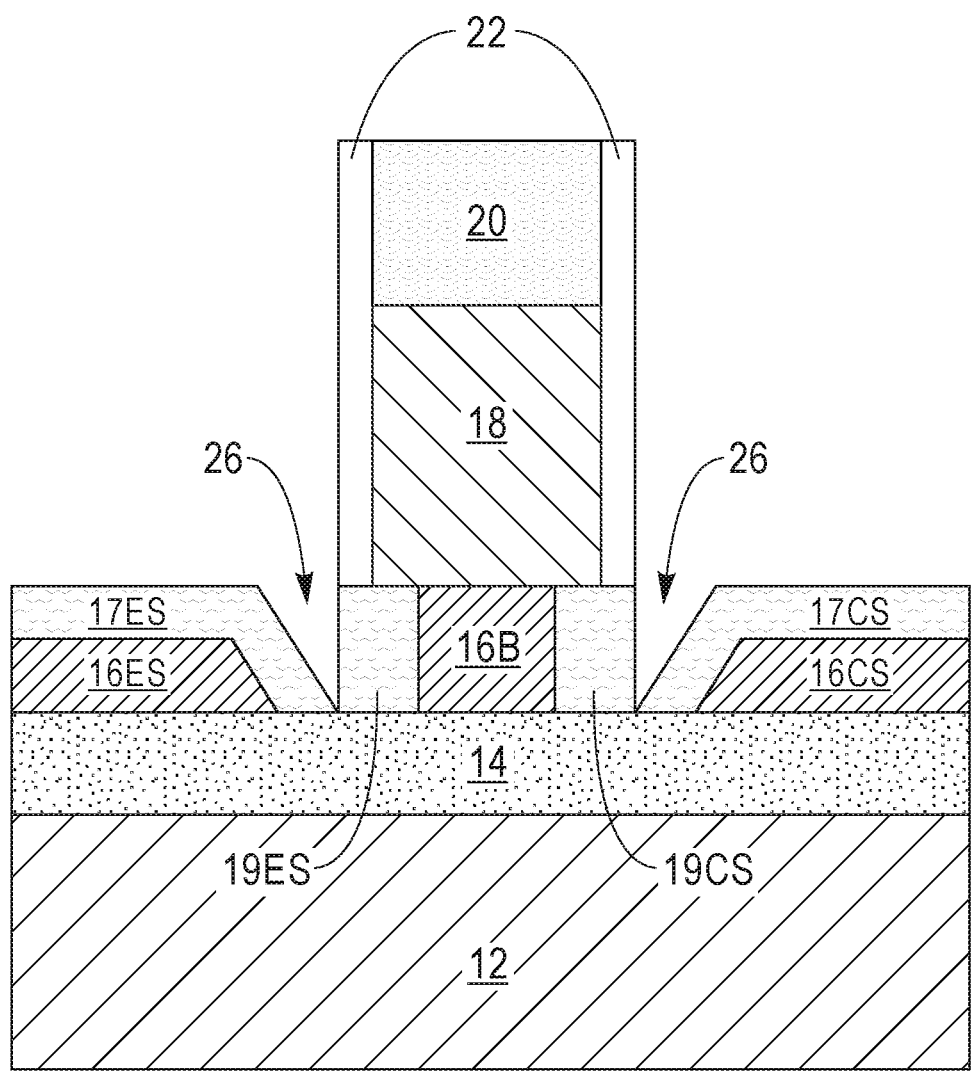
FIG. 6 is a cross sectional view of the exemplary semiconductor structure of FIG. 5 after forming a junction into outermost edges of the intrinsic base layer that is present beneath the dielectric spacer and the sacrificial gate structure, and into an upper portion of the physically exposed surfaces of the faceted intrinsic base portion present in both the emitter-side and the collector-side.

Referring now to FIG. 6, there is illustrated the exemplary semiconductor structure of FIG. 5 after forming a junction into outermost edges of the intrinsic base layer (i.e., the intrinsic base layer portion 16P) that is present beneath the dielectric spacer 22 and the sacrificial gate structure 17, and into an upper portion of the physically exposed surfaces of the faceted intrinsic base portion (16ES, 16CS) present in both the emitter-side, ES, and the collector-side, CS. In some embodiments, junction formation can be omitted. After forming the junction into outermost edges the intrinsic base layer portion 16P, a portion of the intrinsic base layer portion 16P remains. The remaining portion of the intrinsic base layer portion 16P that remains after junction formation can be referred to as lower intrinsic base region 16B. The lower intrinsic base region 16B is composed of the first semiconductor material of the first conductivity (and the lower intrinsic base region 16B has the dopant concentration mentioned above for the intrinsic base layer 16). In some embodiments, the lower intrinsic base region 16B has a width that is less than a width of the sacrificial gate structure 17. In one embodiment, the width of the lower intrinsic base region 16B is from 1 nm to 5 nm. When junction formation is omitted, the intrinsic base layer portion serves as the lower intrinsic base region of the present application.

The junctions are formed by utilizing an angled ion implantation process in which a second conductivity type dopant, opposite to the first conductivity type dopant, is implanted into the outermost edges of the intrinsic base layer portion 16P that is present beneath the dielectric spacer 22 and the sacrificial gate structure 17, and into the upper portion of the physically exposed surfaces of the faceted intrinsic base portion (16ES, 16CS) present in both the emitter-side, ES, and the collector-side, CS. In one embodiment, and when the first conductivity type is n-type, a p-type dopant, as defined above, can be implanted during this step of the present application. Alternatively, and in another embodiment, and when the first conductivity type is p-type, an n-type dopant, as defined above, can be implanted during this step of the present application. A thermal anneal such as laser annealing, flash annealing, rapid thermal annealing (RTA) or any suitable combination of those techniques follows the angled ion implantation process.

Notably, a first emitter-side junction 19ES composed of the first semiconductor material of the second conductivity type is formed in a first outermost edge of the intrinsic base layer portion 16P, and a first collector-side junction 19CS composed of the first semiconductor material of the second conductivity type is formed in a second outermost edge, opposite the first outermost edge, of the intrinsic base layer portion 16P. The concentration of second conductivity type dopant that is present in the first emitter-side junction 19ES and the first collector-side junction 19CS is from $1 \times 10^{19}$ atoms/cm$^3$ to $5 \times 10^{21}$ atoms/cm$^3$. The first emitter-side junction 19ES and the first collector-side junction 19CS are located beneath the dielectric spacer 22 and an outermost portion of the sacrificial gate structure 17. The first emitter-side junction 19ES and the first collector-side junction 19CS are vertically orientated, and have a width of about 10 nm (the term 'about" denotes that a value may vary between ±10% of a given value).

Also, a second emitter-side junction 17ES composed of the first semiconductor material of the second conductivity type is formed in the upper portion of the physically exposed emitter-side faceted intrinsic base portion 16ES, and a second collector-side junction 17CS composed of the first semiconductor material of the second conductivity type is formed in the upper portion of the physically exposed collector-side faceted intrinsic base portion 16CS. The second emitter-side junction 17ES and the second collector-side junction 17CS have a faceted surface. The concentration of second conductivity type dopant that is present in the second emitter-side junction 17ES and the second collector-side junction 17CS is from $1\times10^{19}$ atoms/cm$^3$ to $5\times10^{21}$ atoms/cm$^3$. The notch 26 is still present in the emitter-side, ES, and the collector-side, CS.

Figure 7:
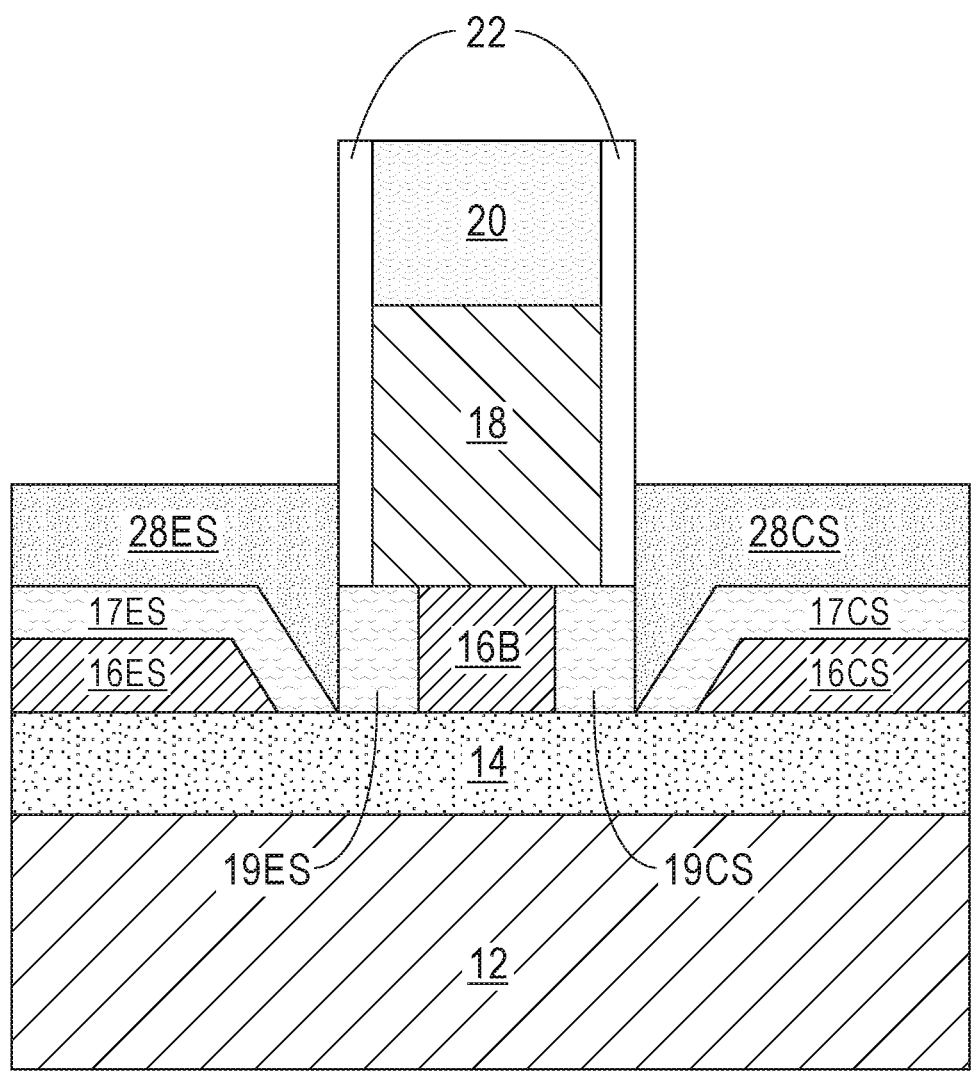
FIG. 7 is a cross sectional view of the exemplary semiconductor structure of FIG. 6 after forming an emitter region composed of a second semiconductor material of a second conductivity type that is opposite the first conductivity type in the emitter-side of the sacrificial gate structure and a collector region composed of the second semiconductor material of the second conductivity type in the collector-side of the sacrificial gate structure.

Referring now to FIG. 7, there is illustrated the exemplary semiconductor structure of FIG. 6 after forming an emitter region 28ES composed of a second semiconductor material of the second conductivity type that is opposite the first conductivity type in the emitter-side, ES, and a collector region 28CS composed of the second semiconductor material of the second conductivity type in the collector-side, CS. As is shown, the emitter region 28ES is formed on the second emitter-side junction 17ES and fills in the notch 26 present in the emitter-side, ES, and the collector region 28CS is formed on the second collector-side junction 17CS and fills in the notch 26 present in the collector-side, CS. In some embodiments, the emitter region 28ES contacts the lower intrinsic base region 16B through the first emitter-side junction 19ES, and the collector region contacts the lower intrinsic base region 16B through the first collector-side junction 19CS.

The second semiconductor material that provides the emitter region 28ES and the collector region 28CS is composed of one of the semiconductor materials mentioned above for semiconductor substrate 12. In one embodiment, the second semiconductor material that provides the emitter region 28ES and the collector region 28CS can be compositionally the same as the first semiconductor material that provides the intrinsic base layer 16. In another embodiment, the second semiconductor material that provides the emitter region 28ES and the collector region 28CS can be compositionally different from the first semiconductor material that provides the intrinsic base layer 16. The concentration of second conductivity type dopant that is present in the emitter region 28ES and the collector region 28CS is from $1\times10^{19}$ atoms/cm$^3$ to $5\times10^{21}$ atoms/cm$^3$.

The emitter region 28ES and the collector region 28CS can be formed utilizing an epitaxial growth process as mentioned above. The second conductivity type dopant that is present in the emitter region 28ES and the collector region 28CS is typically introduced during the epitaxial growth process.

Figure 8:
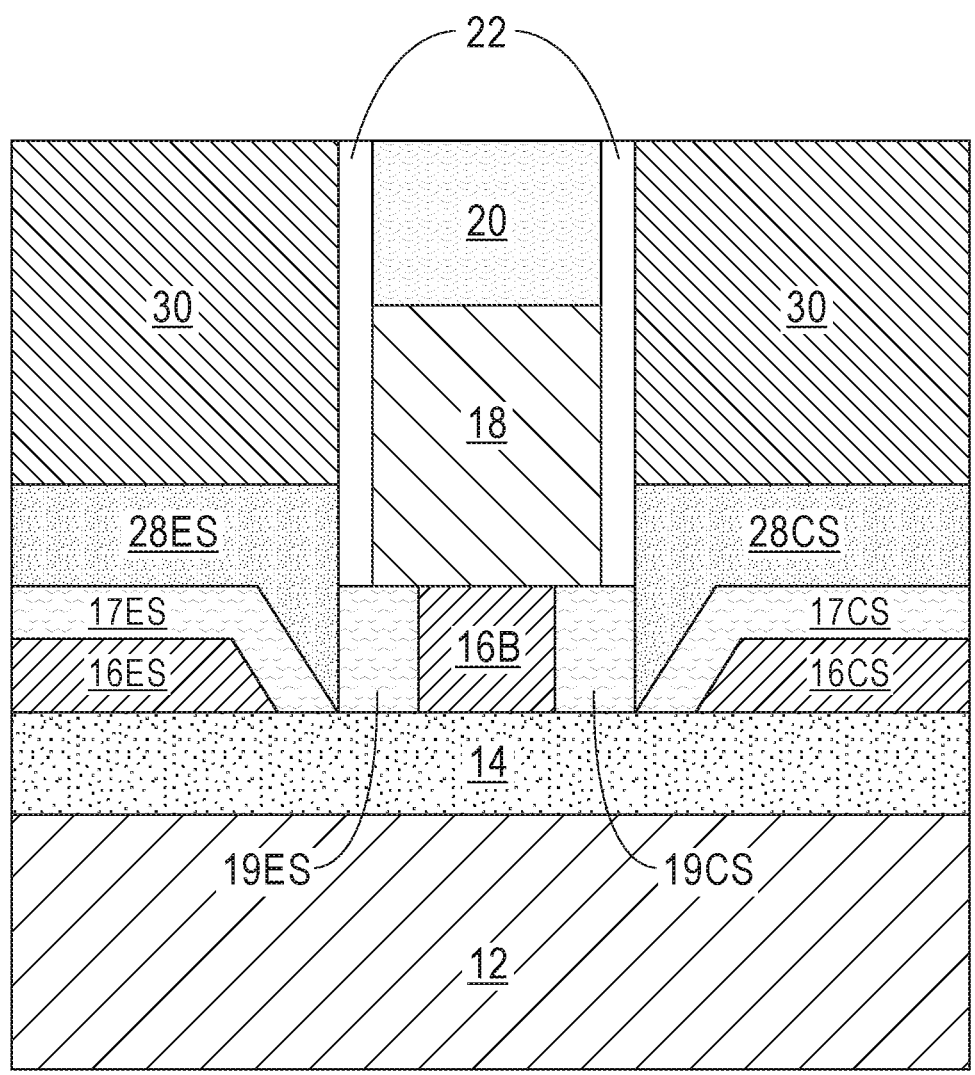
FIG. 8 is a cross sectional view of the exemplary semiconductor structure of FIG. 7 after forming an interlayer dielectric (ILD) material laterally adjacent to an upper portion of the sacrificial gate structure and in the emitter region and the collector region.

Referring now to FIG. 8, there is illustrated the exemplary semiconductor structure of FIG. 7 after forming an interlayer dielectric (ILD) material 30 laterally adjacent to an upper portion of the sacrificial gate structure 17 and in the emitter region, ES and the collector region, CS. As is shown, the ILD material 30 is formed on the emitter region 28ES and on the collector region 28CS. As is further shown, the ILD material 30 has a topmost surface that is coplanar with a topmost surface of the dielectric spacer 22 and the sacrificial gate structure 17.

The ILD material 30 is composed of a dielectric material that is compositionally different from the dielectric material of either the dielectric spacer 22 and the sacrificial gate cap material 20. Examples of dielectric materials that can be used as ILD material 30 include silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide.

In one embodiment, the ILD material 30 can be formed by a deposition process such as, for example, chemical vapor deposition (CVD), plasma enhanced chemical vapor deposition (PECVD), evaporation or spin-on coating. Following the deposition of the ILD material 30, a planarization process such as, for example, chemical mechanical polishing (CMP) and/or grinding, is typically employed.

Figure 9:
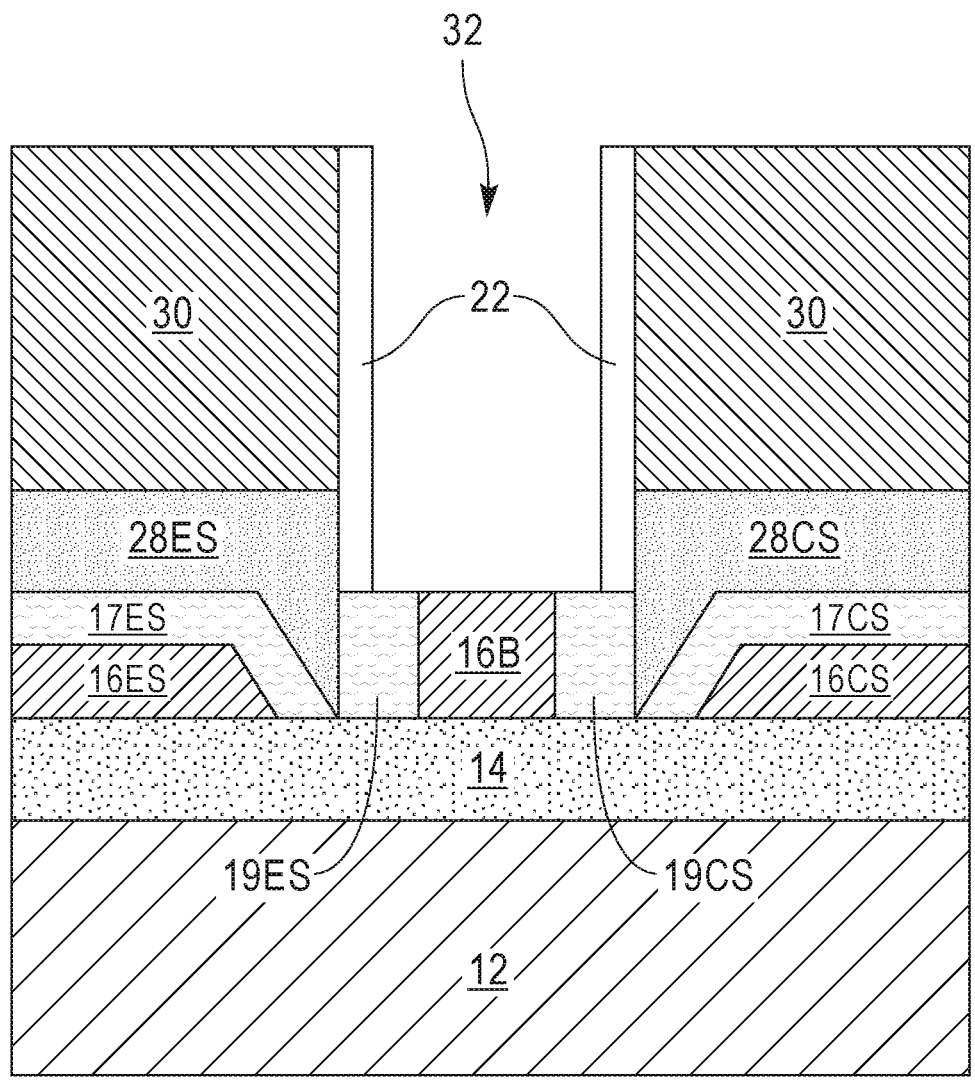
FIG. 9 is a cross sectional view of the exemplary semiconductor structure of FIG. 8 after removing the sacrificial gate structure to create a cavity and to physically expose a surface of a remaining portion of the intrinsic base layer (i.e., a lower intrinsic base region).

Referring now to FIG. 9, there is illustrated the exemplary semiconductor structure of FIG. 8 after removing the sacrificial gate structure 17 including the sacrificial gate cap material 20, the sacrificial gate material 18, and, if present, the sacrificial gate dielectric material, to create a cavity 32 and to physically expose a surface of a remaining portion of the intrinsic base layer (i.e., a lower intrinsic base region 16B). The cavity 32 can physically expose a portion of the first emitter-side junction 19ES that is laterally adjacent to a first side of the lower intrinsic base region 16B, and a portion of the first collector-side junction 19CS that is located laterally adjacent to a second side of the lower intrinsic base region 16B that is opposite the first side of lower intrinsic base region 16B.

The removal of the sacrificial gate structure 17 including the sacrificial gate cap material 20, the sacrificial gate material 18, and, if present, the sacrificial gate dielectric material includes one or more anisotropic etching processes. In one example, the one or more anisotropic etching processes include one or more reactive ion etching (RIE) processes.

Figure 10A:
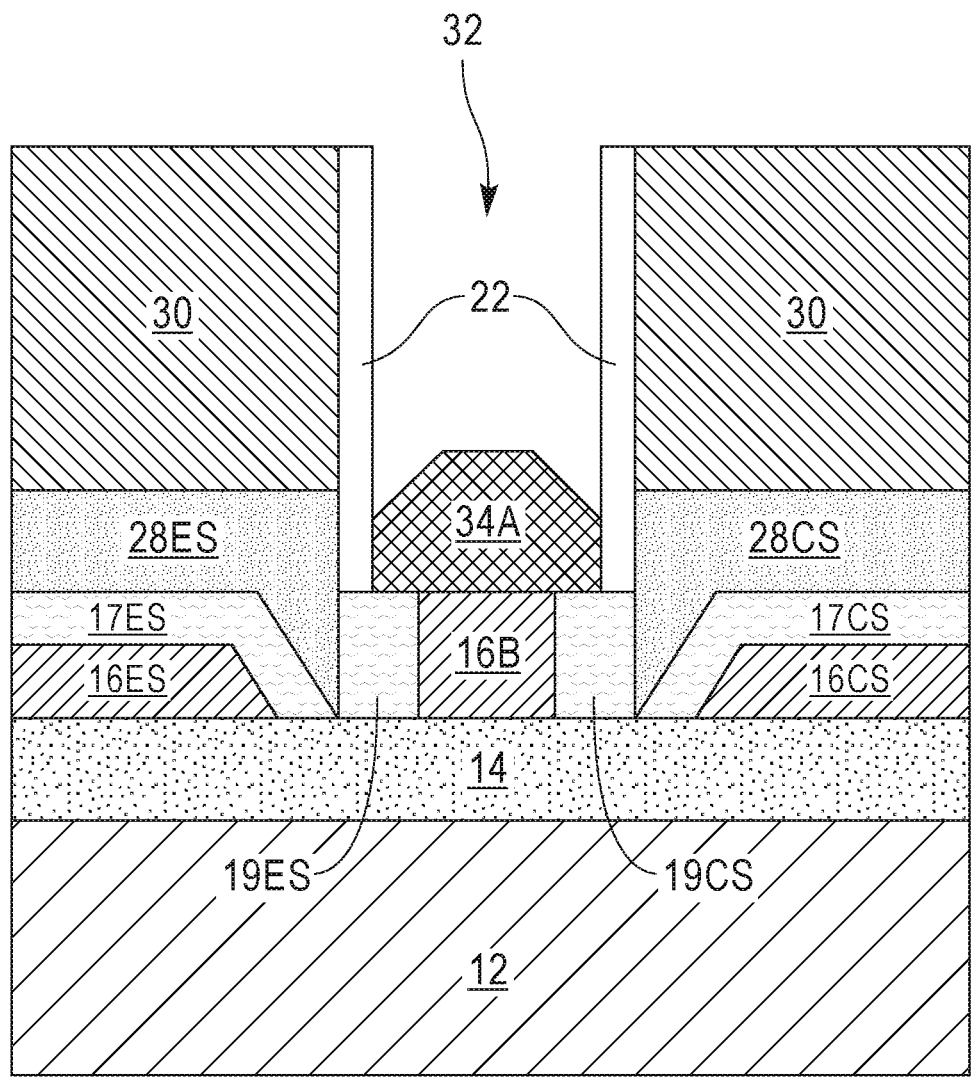
FIG. 10A is a cross sectional view of the exemplary semiconductor structure of FIG. 9 after forming an upper intrinsic base region composed of a third semiconductor material of the first conductivity type in a lower portion of the cavity and on the physically exposed surface of the lower intrinsic base region in accordance with one embodiment of the present application.

Referring now to FIG. 10A, there is illustrated the exemplary semiconductor structure of FIG. 9 after forming an upper intrinsic base region 34A composed of a third semiconductor material of the first conductivity type in a lower portion of the cavity 28 and on the physically exposed surface of the lower intrinsic base region 16B in accordance with one embodiment of the present application.

The third semiconductor material that provides the upper intrinsic base region 34A is composed of one of the semiconductor materials mentioned above for semiconductor substrate 12. In one embodiment, the third semiconductor material that provides the upper intrinsic base region 34A can be compositionally the same as the first semiconductor material that provides the intrinsic base layer 16. In such an embodiment, the third semiconductor material that provides the upper intrinsic base region 34A can be compositionally the same as, or compositionally different from, the second semiconductor material that provides the emitter region 28ES and the collector region 28CS. In another embodiment, the third semiconductor material that provides the upper intrinsic base region 34A can be compositionally different from the first semiconductor material that provides the intrinsic base layer 16. In such an embodiment, the third semiconductor material that provides the upper intrinsic base region 34A can be compositionally the same as, or compositionally different from, the second semiconductor material that provides the emitter region 28ES and the collector region 28CS.

The concentration of first conductivity type dopant that is present in the upper intrinsic base region 34A is less than the dopant concentration of the first conductivity type dopant present in the lower intrinsic base region 16B. In one embodiment, the concentration of first conductivity type dopant that is present in the upper intrinsic base region 34A is from $1\times10^{16}$ atoms/cm$^3$ to $1\times10^{18}$ atoms/cm$^3$.

The upper intrinsic base region 34A is formed utilizing an epitaxial growth process as defined above. The faceted surface is provided by tuning/selecting epitaxial growth conditions including but not limited to, pressure, temperature and precursor flow rates. The first conductivity type dopant that is present in the upper intrinsic base region 34A is typically introduced during the epitaxial growth process. In this embodiment, the upper intrinsic base region 34A has faceted surface and is pyramidal in shape.

Figure 10B:
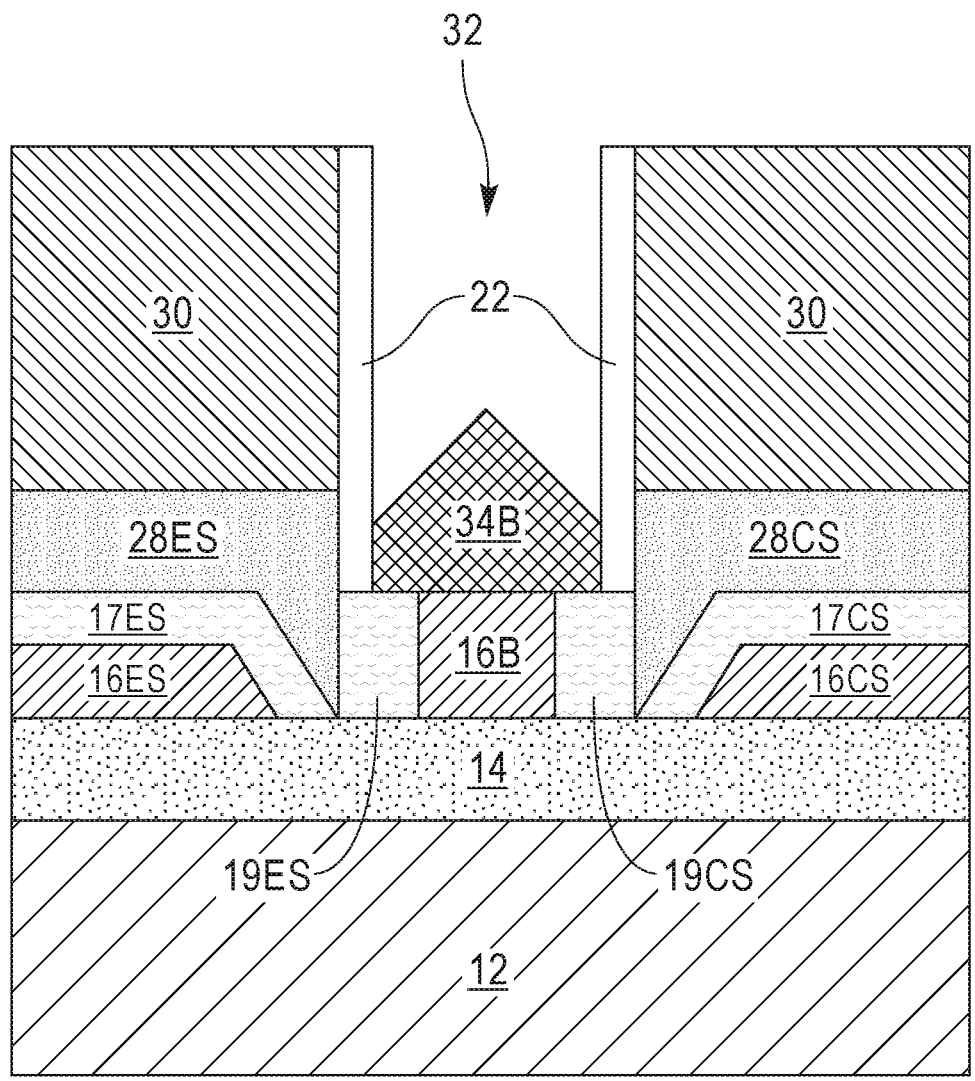
FIG. 10B is a cross sectional view of the exemplary semiconductor structure of FIG. 9 after forming an upper intrinsic base region composed of a third semiconductor material of the first conductivity type in a lower portion of the cavity and on the physically exposed surface of the lower intrinsic base region in accordance with another embodiment of the present application.

Referring now to FIG. 10B, there is illustrated the exemplary semiconductor structure of FIG. 9 after forming an upper intrinsic base region 34B composed of a third semiconductor material of the first conductivity type in a lower portion of the cavity 28 and on the physically exposed surface of the lower intrinsic base region 16B in accordance with another embodiment of the present application. The upper intrinsic base region 34B of this embodiment is the same as the upper intrinsic base region 34A described in the previous embodiment except that the upper intrinsic base region 34B has a triangular shape with the base of the triangle located on a surface of the lower intrinsic base region 16B and a tip region that is located opposite the base region of the triangular shaped upper intrinsic base region 34B. The faceted surface is provided by tuning/selecting epitaxial growth conditions including but not limited to, pressure, temperature and precursor flow rates.

Figure 10C:
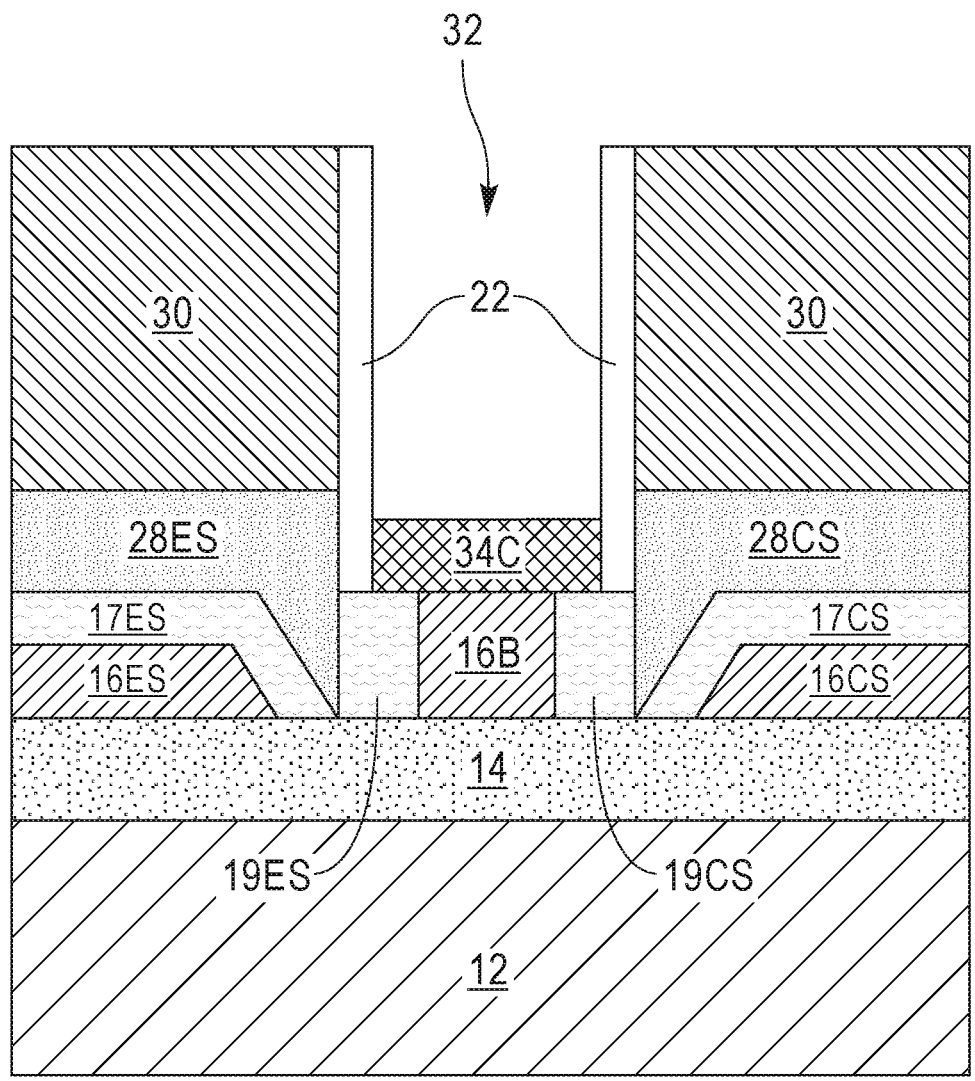
FIG. 10C is a cross sectional view of the exemplary semiconductor structure of FIG. 9 after forming an upper intrinsic base region composed of a third semiconductor material of the first conductivity type in a lower portion of the cavity and on the physically exposed surface of the lower intrinsic base region in accordance with other embodiment of the present application.

Referring now to FIG. 10C, there is illustrated the exemplary semiconductor structure of FIG. 9 after forming an upper intrinsic base region 34C composed of a third semiconductor material of the first conductivity type in a lower portion of the cavity 28 and on the physically exposed surface of the lower intrinsic base region 16B in accordance with yet another embodiment of the present application. The upper intrinsic base region 34C of this embodiment is the same as the upper intrinsic base region 34A described in the previous embodiment except that the upper intrinsic base region 34C has non-faceted surface (i.e., an entirely planar topmost surface). The non-faceted surface is provided by tuning/selecting epitaxial growth conditions including but not limited to, pressure, temperature and precursor flow rates.

Figure 11:
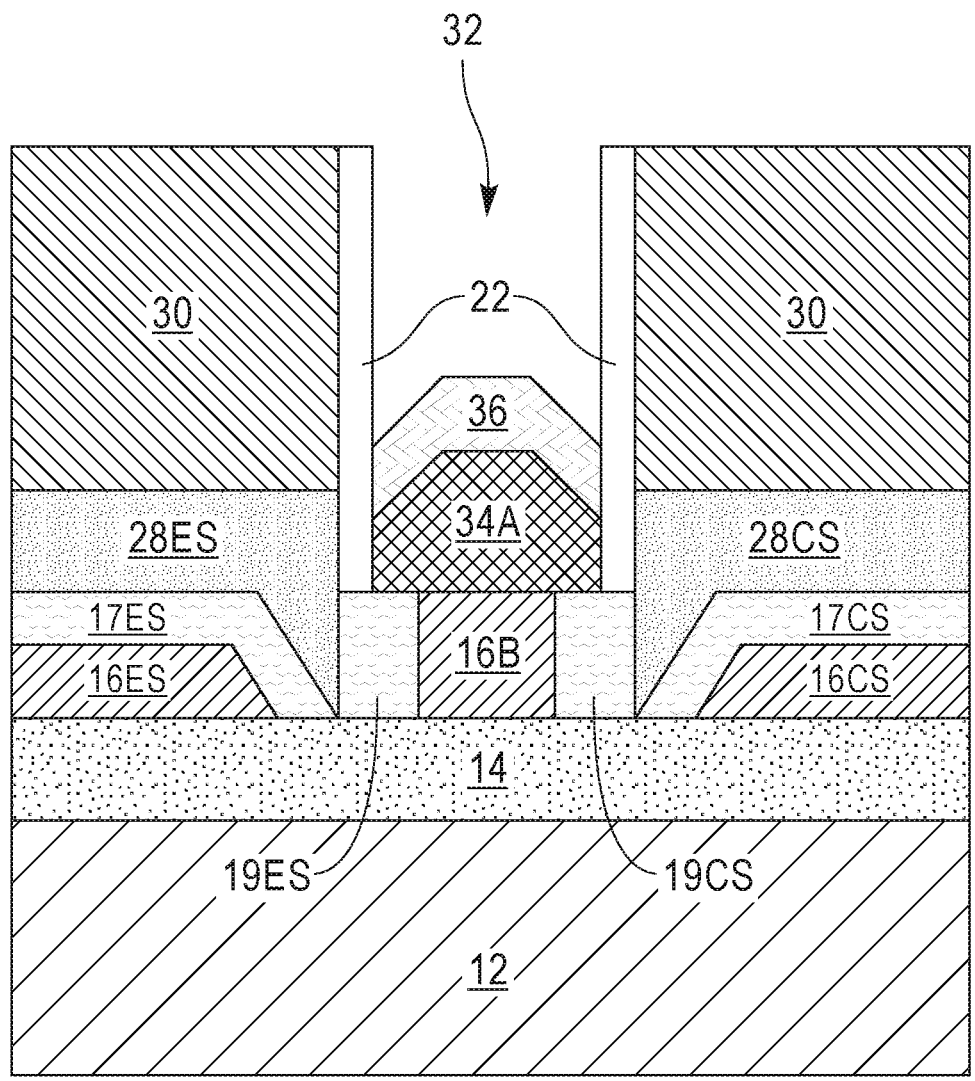
FIG. 11 is a cross sectional view of the exemplary semiconductor structure of FIG. 10A after forming an extrinsic base region composed of a fourth semiconductor material of the first conductivity type on the upper intrinsic base region.

Referring now to FIG. 11, there is illustrated the exemplary semiconductor structure of FIG. 10A after forming an extrinsic base region 36 composed of a fourth semiconductor material of the first conductivity type on the upper intrinsic base region 34A. Although the present application describes and illustrates forming the extrinsic base region 36 on the upper intrinsic base region 34A shown in FIG. 10A, the present application contemplates embodiments in which the extrinsic base region 36 is formed on the upper intrinsic base region 34B shown in FIG. 10B, and in which the extrinsic base region 36 is formed on the upper intrinsic base region 34C shown in FIG. 10C.

The fourth semiconductor material that provides the extrinsic base region 36 is composed of one of the semiconductor materials mentioned above for semiconductor substrate 12. In one embodiment, the fourth semiconductor material that provides the extrinsic base region 36 can be compositionally the same as the first semiconductor material that provides the intrinsic base layer 16. In such an embodiment, the fourth semiconductor material that provides the extrinsic base region 36 can be compositionally the same as, or compositionally different from the second semiconductor material that provides the emitter region 28ES and the collector region 28CS, and or compositionally the same as, or compositionally different from third semiconductor material that provides the upper intrinsic base region 34A, 34B or 34C.

In another embodiment, the fourth semiconductor material that provides the extrinsic base region 36 can be compositionally different from the first semiconductor material that provides the intrinsic base layer 16. In such an embodiment, the fourth semiconductor material that provides the extrinsic base region 36 can be compositionally the same as, or compositionally different from the second semiconductor material that provides the emitter region 28ES and the collector region 28CS, and or compositionally the same as, or compositionally different from third semiconductor material that provides the upper intrinsic base region 34A, 34B or 34C.

The concentration of first conductivity type dopant that is present in the extrinsic base region 36 is greater than the dopant concentration of the first conductivity type dopant present in the lower intrinsic base region 16B and the upper intrinsic base region 24A, 34B or 34C. In one embodiment, the concentration of first conductivity type dopant that is present in the extrinsic base region 36 is from $1\times10^{19}$ atoms/cm$^3$ to $5\times10^{21}$ atoms/cm$^3$. The extrinsic base region 36 is formed utilizing an epitaxial growth process as defined above.

Figure 12:
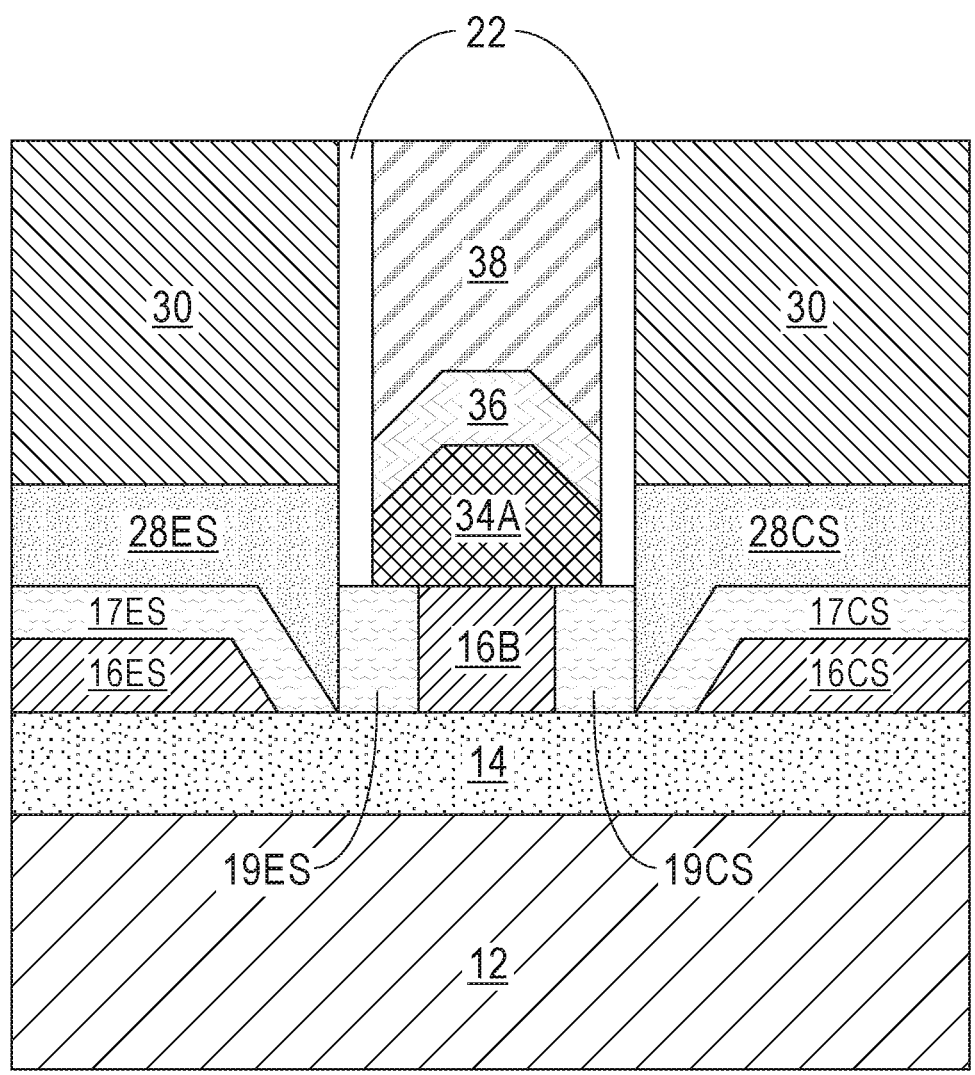
FIG. 12 is a cross sectional view of the exemplary structure of FIG. 11 after forming a metal-containing fill material on the extrinsic base region and within a remaining portion of the cavity.

Referring now to FIG. 12, there is illustrated the exemplary structure of FIG. 11 after forming a metal-containing fill material 38 on the extrinsic base region 36 and within a remaining portion of the cavity 28. The metal-containing fill material 38 can be referred to herein as base contact structure since it contacts the extrinsic base region 36 of the exemplary semiconductor structure.

The metal-containing fill material 38 includes a contact metal or a contact metal alloy. Examples of contact metals include, but are not limited to, tungsten (W), aluminum (Al), copper (Cu), or cobalt (Co). An example of a contact metal alloy is Cu—Al alloy. The forming of the metal-containing fill material 38 includes at least depositing a contact metal or a contact metal alloy on the extrinsic base region 36 and within a remaining portion of the cavity 28. The depositing of the contact metal or contact metal alloy can include, but is not limited to, chemical vapor deposition (CVD), plasma enhanced chemical vapor deposition (PECVD), atomic layer deposition (ALD), sputtering, or plating. A planarization process such as, for example, chemical mechanical polishing, can follow the deposition of metal-containing fill material 38. In some embodiments (not shown), a diffusion barrier material such as for example, at least one of Ti, Ta, TiN or TaN is formed into cavity 28 prior to forming the contact metal or metal alloy.

As is shown, the metal-containing fill material 38 has a topmost surface that is coplanar with a topmost surface of the ILD material 30 as well as a topmost surface of the dielectric spacer 22. As is further shown, the dielectric spacer 22 is located on outermost sidewalls of the upper intrinsic base region 34A, the extrinsic base region 36 and the metal-containing fill material 38.

Thus, each of the dielectric spacer 22 is located on outermost sidewalls of the upper intrinsic base region 34A, the extrinsic base region 36 and the metal-containing fill material 38 is confined by the laterally adjacent dielectric spacer 22.

Figure 13:
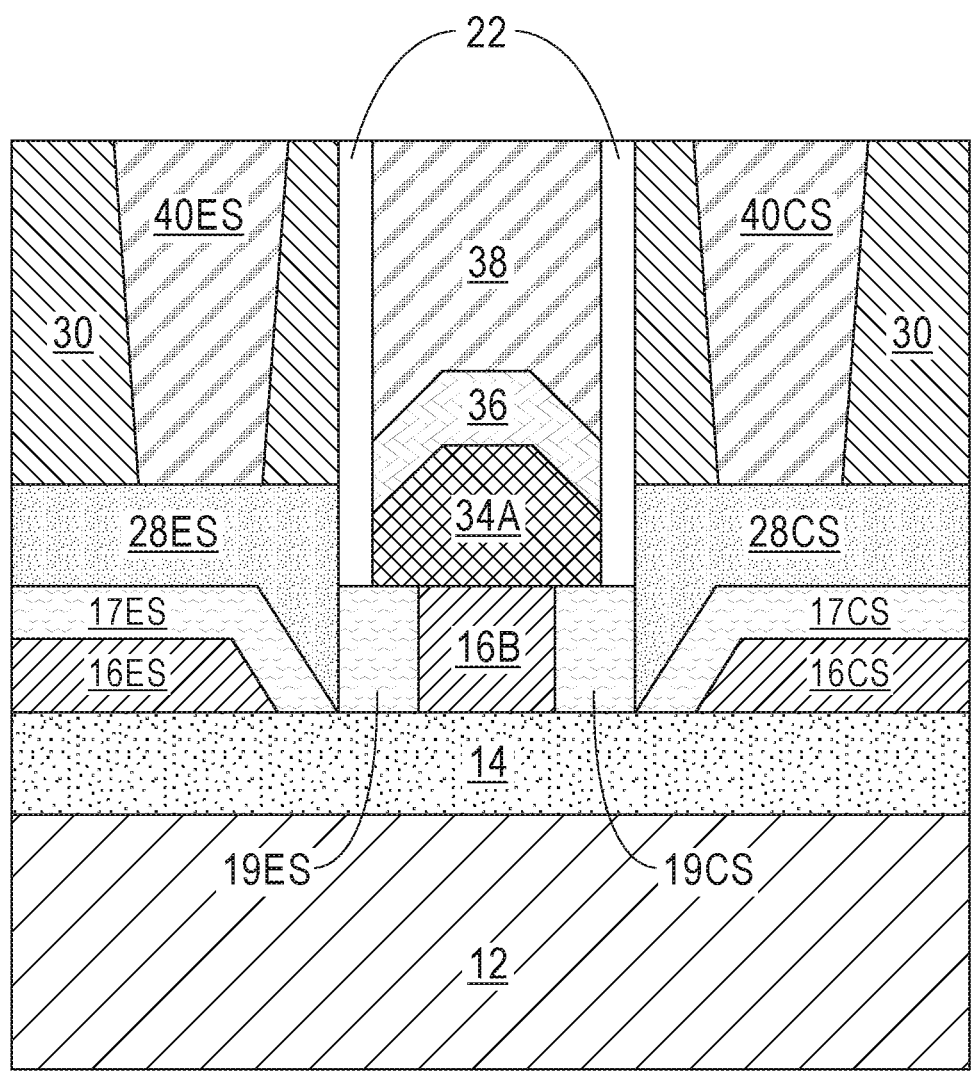
FIG. 13 is a cross sectional view of the exemplary semiconductor structure after forming a first metal contact structure in the ILD material present in the emitter-side, and a second metal contact structure in the ILD material present in the collector-side.

Referring now to FIG. 13, there is illustrated the exemplary semiconductor structure after forming a first metal contact structure (hereinafter emitter-side contact structure 40ES) in the ILD material 30 present in the emitter-side, ES, and a second metal contact structure (hereinafter collector-side contact structure 40CS) in the ILD material 30 present in the collector-side, CS.

The emitter-side contact structure 40ES and the collector-side contact structure 40CS can be formed by first providing a contact opening in the ILD material 30 and in the respective side of the exemplary structure. The contact openings can be formed by lithography and etching. Lithography includes forming a photoresist material on a material or material stack that needs to be patterned, exposing the photoresist material to a desired pattern of irradiation, and developing the exposed photoresist material. The etch used to form the contact openings can include a dry etching process or a chemical wet etching process. The contact openings can have vertical sidewalls or they can have tapered sidewalls. Each contact opening is then filled with a contact metal or contact metal alloy, as defined above. A planarization process may follow the filling of each contact opening. In some embodiments (not shown), a diffusion barrier material such as for example, at least one of Ti, Ta, TiN or TaN is formed into each contact opening prior to forming the contact metal or metal alloy.

The emitter-side contact structure 40ES contacts a surface of the emitter region 28ES, and the collector-side contact structure 40CS contacts a surface of the collector region 28CS. The emitter-side contact structure 40ES has a topmost surface that is coplanar with a topmost surface of the collector-side contact structure 40CS, and the topmost surface of both contact structures (40ES, 40CS) is coplanar with the ILD material 30, the dielectric spacer 22, and the metal-containing fill material 38.

Notably, the exemplary semiconductor structure of FIG. 13 illustrates a lateral BJT in accordance with an embodiment of the present application. The lateral BJT shown in FIG. 13 includes lower intrinsic base region 16B composed of the first semiconductor material of the first conductivity type that is located on a surface of layer 14 that is composed of that at least partially insulating material. Emitter region 28ES composed of the second semiconductor material of the second conductivity type, opposite the first conductivity type, is located laterally adjacent to, and contacting, a first side of the lower intrinsic base region 16B, and collector region 28CS composed of the second semiconductor material of the second conductivity is located laterally adjacent to, and contacting, a second side of the lower intrinsic base region 16B, which is opposite the first side of the lower intrinsic base region 16B. Upper intrinsic base region 34A (or 34B or 34C) composed of the third semiconductor material of the first conductivity type is located on the lower intrinsic base region 16B. The upper intrinsic base region 34A (or 34B or 34C) has a lower dopant concentration than the lower intrinsic base region 16B. Extrinsic base region 36 composed of the fourth semiconductor material of the first conductivity type is located on the upper intrinsic base region 34A (or 34B or 36C). The extrinsic base region 36 has a higher dopant concentration than both the upper and lower intrinsic base regions. A metal-containing fill material 38 is located on the extrinsic base region 36.

In one embodiment, the lateral BJT of the present application may be PNP lateral BJT in which the first conductivity type is n-type and the second conductivity type is p-type. In another embodiment, the lateral BJT of the present application may be NPN lateral BJT in which the first conductivity type is p-type and the second conductivity type is n-type.

In some embodiments of the present application, the first, second, third and fourth semiconductor materials of the lateral BJT are compositionally the same. In another embodiment, the first semiconductor material is compositionally different from at least the second semiconductor material. In such an embodiment, the first semiconductor material can be compositionally the same as the third semiconductor material, but compositionally different from the fourth semiconductor material, or the first semiconductor material can be compositionally different from the third and fourth semiconductor materials.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A lateral bipolar junction transistor (BJT) comprising:
   a lower intrinsic base region composed of a first semiconductor material of a first conductivity type and located on a surface of a layer that is composed of at least a partially insulating material;
   an emitter region composed of a second semiconductor material of a second conductivity type, opposite the first conductivity type, located laterally adjacent to, and contacting, a first side of the lower intrinsic base region;
   a collector region composed of the second semiconductor material of the second conductivity located laterally adjacent to, and contacting, a second side of the lower intrinsic base region, which is opposite the first side of the lower intrinsic base region;
   an upper intrinsic base region composed of a third semiconductor material of the first conductivity type located on the lower intrinsic base region, wherein the upper intrinsic base region has a lower dopant concentration than the lower intrinsic base region;
   an extrinsic base region composed of a fourth semiconductor material of the first conductivity type located on the upper intrinsic base region, wherein the extrinsic base region has a higher dopant concentration than both the upper and lower intrinsic base regions; and
   a metal-containing fill material located on the extrinsic base region.

2. The lateral BJT of claim 1, further comprising a dielectric spacer located on outermost sidewalls of each of the upper intrinsic base region, the extrinsic base region, and the metal-containing fill material, wherein the dielectric spacer has a topmost surface that is coplanar with a topmost surface of the metal-containing fill material.

3. The lateral BJT of claim 1, further comprising a first emitter-side junction composed of the first semiconductor material of the second conductivity type located between the lower intrinsic base region and the emitter region, and a first collector-side junction composed of the first semiconductor material of the second conductivity type located between the lower intrinsic base region and the collector region.

4. The lateral BJT of claim 3, further comprising an emitter-side faceted intrinsic base portion composed of the first semiconductor material of the first conductivity type located beneath the emitter region and on the layer that is composed of the at least partially insulating material, and a collector-side faceted intrinsic base portion composed of the first semiconductor material of the first conductivity type located beneath the collector region and on the layer that is composed of the at least partially insulating material.

5. The lateral BJT of claim 4, further comprising a second emitter-side junction composed of the first semiconductor material and having the second conductivity type located between the emitter-side faceted intrinsic base portion and the emitter region, and a second collector-side junction composed of the first semiconductor material and having the second conductivity type located between the collector-side faceted intrinsic base portion and the collector region.

6. The lateral BJT of claim 1, wherein the first conductivity type is n-type and the second conductivity type is p-type.

7. The lateral BJT of claim 1, wherein the first conductivity type is p-type and the second conductivity type is n-type.

8. The lateral BJT of claim 1, wherein the first, second, third and fourth semiconductor materials are compositionally the same.

9. The lateral BJT of claim 1, wherein the first semiconductor material is compositionally different from at least the second semiconductor material.

10. The lateral BJT of claim 9, wherein the first semiconductor material is compositionally the same as the third semiconductor material, but compositionally different from the fourth semiconductor material.

11. The lateral BJT of claim 9, wherein the first semiconductor material is compositionally different from the third and fourth semiconductor materials.

12. The lateral BJT of claim 1, wherein the upper intrinsic base region has a non-faceted surface that directly contacts the extrinsic base region.

13. The lateral BJT of claim 1, wherein the upper intrinsic base region has a faceted surface that directly contacts the extrinsic base region.

14. The lateral BJT of claim 2, further comprising an interlayer dielectric (ILD) material adjacent to the dielectric spacer and located above both the emitter region and the collector region, wherein the ILD material has a topmost surface that is coplanar to the topmost surface of both the dielectric spacer and the metal-containing fill material.

15. The lateral BJT of claim 14, further comprising an emitter-side contact structure located in the ILD material and directly contacting a surface of the emitter region, and a collector-side contact structure located in the ILD material and directly contacting a surface of the collector region.

16. A method of forming a lateral bipolar junction transistor (BJT), the method comprising:
  forming a sacrificial gate structure on a surface of an intrinsic base layer composed of a first semiconductor material of a first conductivity type, wherein a dielectric spacer is present along a sidewall of the sacrificial gate structure and in both an emitter-side and a collector-side of the sacrificial gate structure;
  creating a notch into the intrinsic base layer that is located on both the emitter-side and the collector-side of the sacrificial gate structure to provide a faceted intrinsic base portion in both the emitter-side and the collector-side;
  forming an emitter region composed of a second semiconductor material of a second conductivity type that is opposite the first conductivity type above the faceted intrinsic base portion that is present in the emitter-side of the sacrificial gate structure and a collector region composed of the second semiconductor material of the second conductivity type above the faceted intrinsic base portion that is present in the collector-side of the sacrificial gate structure;
  forming an interlayer dielectric (ILD) material laterally adjacent to an upper portion of the sacrificial gate structure and on the emitter region and the collector region;
  removing the sacrificial gate structure to create a cavity and to physically expose a surface of a remaining portion of the intrinsic base layer which defines a lower intrinsic base region;
  forming an upper intrinsic base region composed of a third semiconductor material of the first conductivity type in a lower portion of the cavity and on the physically exposed surface of the lower intrinsic base region, wherein the upper intrinsic base region has a lower dopant concentration than the lower intrinsic base region;
  forming an extrinsic base region composed of a fourth semiconductor material of the first conductivity type on the upper intrinsic base region, wherein the extrinsic base region has a higher dopant concentration than both the upper and lower intrinsic base regions; and
  forming a metal-containing fill material on the extrinsic base region and within a remaining portion of the cavity.

17. The method of claim 16, further comprising forming, prior to the forming of the emitter region and the collector region, a first junction into outermost edges of the intrinsic base layer that is present beneath the dielectric spacer and the sacrificial gate structure, and a second junction into the physically exposed surfaces of the faceted intrinsic base portion present in both the emitter-side and the collector-side.

18. The method of claim 16, wherein the creating of the notch comprises:
  forming a sacrificial faceted epitaxial semiconductor material in both the emitter-side and the collector-side and on physically exposed portions of the intrinsic base layer that are not covered by the dielectric spacer and the sacrificial gate structure; and
  removing the sacrificial faceted semiconductor material from both the emitter-side and the collector-side of the sacrificial gate structure, wherein during the removal of the sacrificial faceted semiconductor material the notch is created into the intrinsic base layer.

19. The method of claim 16, wherein the upper intrinsic base region has a non-faceted surface that directly contacts the extrinsic base region.

20. The method of claim 16, wherein the upper intrinsic base region has a faceted surface that directly contacts the extrinsic base region.

* * * * *